United States Patent
Saitoh

Patent Number: 5,883,439
Date of Patent: Mar. 16, 1999

[54] SEMICONDUCTOR DEVICE MOLDED IN PLASTIC PACKAGE FREE FROM CRACK BY VIRTUE OF ORGANIC STRESS RELAXATION LAYER

[75] Inventor: Takehiro Saitoh, Tokyo, Japan

[73] Assignee: NEC Corporation, Tokyo, Japan

[21] Appl. No.: 819,261

[22] Filed: Mar. 18, 1997

[30] Foreign Application Priority Data

Mar. 19, 1996 [JP] Japan ................................ 8-063074

[51] Int. Cl.⁶ ........................... H01L 23/28; H01L 23/29
[52] U.S. Cl. ...................... 257/787; 257/791; 257/792; 257/793
[58] Field of Search ................... 257/787, 791, 257/792, 793, 729; 174/121 SR, 122 C, 120 C, 120 R, 110 SR

[56] References Cited

U.S. PATENT DOCUMENTS 5,287,003  2/1994  Van Andel et al. .............. 257/787

FOREIGN PATENT DOCUMENTS 59-23550   2/1984   Japan ........................... 257/792
60-97646   5/1985   Japan ........................... 257/793
1-69039    3/1989   Japan ........................... 257/792
5-275598  10/1993   Japan .

OTHER PUBLICATIONS

Fracture Properties Of Molding Compound Materials For IC Plastic Packaging; John Sauber et al.; Part A. vol.17, No. 4 Dec. 1994 pp. 533–541.

Interface Crack Analysis On Surface With Dimples In LSI Package; Mitsuru Sato; pp. 74–79.

Primary Examiner—Mahshid D. Saadat
Assistant Examiner—Jhihan B. Clark

[57] ABSTRACT

A semiconductor chip is mounted on a die pad of a lead-frame, and the semiconductor chip mounted on the die pad is sealed in a plastic package; a side surface of the semiconductor chip and an exposed upper surface and a side surface of the die pad are covered with an organic stress relaxation layer so as to reduce a thermal stress due to the difference in thermal expansion coefficient between the semiconductor chip and the die pad, thereby presenting the plastic package from a crack.

5 Claims, 7 Drawing Sheets

SEMICONDUCTOR DEVICE MOLDED IN PLASTIC PACKAGE FREE FROM CRACK BY VIRTUE OF ORGANIC STRESS RELAXATION LAYER

FIELD OF THE INVENTION

This invention relates to a semiconductor device and, more particularly, to a highly reliable semiconductor device molded in plastic package.

DESCRIPTION OF THE RELATED ART

A typical example of the semiconductor device molded in a plastic package is illustrated in FIG. 1. The prior art semiconductor device largely comprises a semiconductor chip 1, a lead-frame 2, a plastic package 3 and thin metallic wires 4.

An integrated circuit or a discrete circuit component is fabricated in the semiconductor chip 1, and is electrically connected to bonding pads 1a of aluminum. The lead-frame 2 has a die pad 2a and conductive leads 2b separated from the die pad 2a. The lead-frame 2 is formed of nickel alloy or copper alloy The nickel alloy mainly composed of iron and nickel, and the nickel content is of the order of 42 percent. The nickel alloy is high in mechanical strength, and is effective against a deformation of conductive leads 2b during a fabrication and an assembling work onto a printed board. However, the nickel alloy is smaller in thermal conductivity than the copper alloy, and deteriorates the heat radiation capability of the prior art semiconductor device. If the integrated circuit consumes a large amount of electric power, the semiconductor chip 1 generates much Joule heat, and the lead-frame formed of the nickel alloy is too small to effectively radiate the Joule heat. On the other hand, the copper alloy has a large heat radiation capability, and, accordingly, the lead-frame of the copper alloy is used for such kind of integrated circuit so as to keep the semiconductor chip 1 under 175 degrees in centigrade. Thus, the lead-frame of the copper alloy is desirable for the semiconductor chip 1 which generates a large amount of heat.

The semiconductor chip 1 is bonded to the die pad 2a by means of adhesive compound 5, and the conductive leads 2b are connected through the thin metallic wires 4 to the bonding pads 1a. Silver past is used as the adhesive compound 5, and is formed of epoxy resin containing silver powder. The thin metallic wires 4 are formed of gold, and synthetic resin containing moisture absorbent forms the plastic package 3.

The prior art semiconductor device is fabricated as follows. The lead-frame is unwound from a reel, and the semiconductor chip 1 is firstly adhered to the die pad 2a. Subsequently, the thin metallic wires 4 are connected between the bonding pads 1a and the conductive leads 2b, and the semiconductor chip 1 mounted on the lead-frame 2 is molded in the synthetic resin containing the moisture asborbent. Finally, the conductive leads 2b are separated from the frame, and are bent as shown in FIG. 1.

Thus, the prior art semiconductor device has the semiconductor chip directly held in contact with the plastic package 3, and the exposed surfaces of the die pad 2a are also directly held in contact with the plastic package 3.

When the semiconductor device is completed, the manufacturer examines the reliability of the semiconductor device under design conditions. The semiconductor device is subjected to a heat cycle, and the heat cycle is usually repeated between +150 degrees in centigrade and −65 degrees in centigrade. However, if the lead-frame is formed of the copper alloy, large thermal stress is exerted on the boundary between the semiconductor chip 1 and the adhesive compound 5 and between the die pad 2a and the adhesive compound 5 due to the large difference in thermal expansion coefficient therebetween, and the adhesive compound 5 is liable to be peeled from the semiconductor chip 1 and/or the die pad 2a due to the thermal stress. Thus, the separation 6a takes place along the boundary between the adhesive compound 5 and the semiconductor chip/die pad 2a as shown in FIG. 2A. The separation proceeds along the boundary between the die pad 2a and the plastic package 3 as indicated by reference 6b (see FIG. 2B), and the separation 6b tends to give rise to a crack 6c in the plastic package 3 as shown in FIG. 2C. When the crack 6c reaches the bonding pads 1a, water vapor penetrates along the crack 6c, and erodes the bonding pads 1a. The thin metallic wires 4 tend to be disconnected from the eroded bonding pads 1a, and the semiconductor device falls into a malfunction.

The integrated circuit has been enhanced in integration density, and this tendency would be continued in future. This means that a semiconductor chip of the next generation radiates heat more than that of the semiconductor chip 1. In this situation, if the semiconductor manufacturer continuously uses the lead-frame of the copper alloy for a semiconductor device of the next generation, the crack 6c would take place more frequently, and the manufacturer suffers from a low production yield.

In order to prevent a plastic package from a crack, Japanese Patent Publication of Unexamined Application (JPA) No. 5-275598 proposes to coat the die pad with a thin inorganic film. The inorganic thin film is formed of aluminum oxide, silicon oxide, titanium oxide or chromium oxide, and enhances the adhesion between the die pad and a plastic package. The inorganic thin film prevents the die pad and the plastic package from separation, and, accordingly, is effective against the crack. However, the inorganic thin film is insufficient to a lead-frame for a large semiconductor chip, because the wide die pad is causative of large thermal stress. This is the first problem inherent in the prior art semiconductor device.

Another problem is a high production cost. The inorganic thin film is deposited on the surfaces of the die pad by using an ion-plating, a plasma-assisted chemical vapor deposition or a sputtering. These deposition systems are so expensive that the production cost of the semiconductor device is increased.

SUMMARY OF THE INVENTION

It is therefore an important object of the present invention to provide a semiconductor device which is free from the crack and low in production cost.

To accomplish the object, the present invention proposes to relax a thermal stress.

In accordance with the present invention, there is provided a semiconductor device comprising: a semiconductor chip having at least one electric element; a conductive supporting structure including at least a die pad having a central area assigned to the semiconductor chip for mounting and a peripheral area around the central area; a package formed of a synthetic resin for sealing the semiconductor chip mounted on the die pad therein; and a stress relaxation layer formed of an organic compound smaller in elastic modulus than the synthetic resin, and covering at least a side surface of the semiconductor chip.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENTS

First Embodiment

Figure 3:
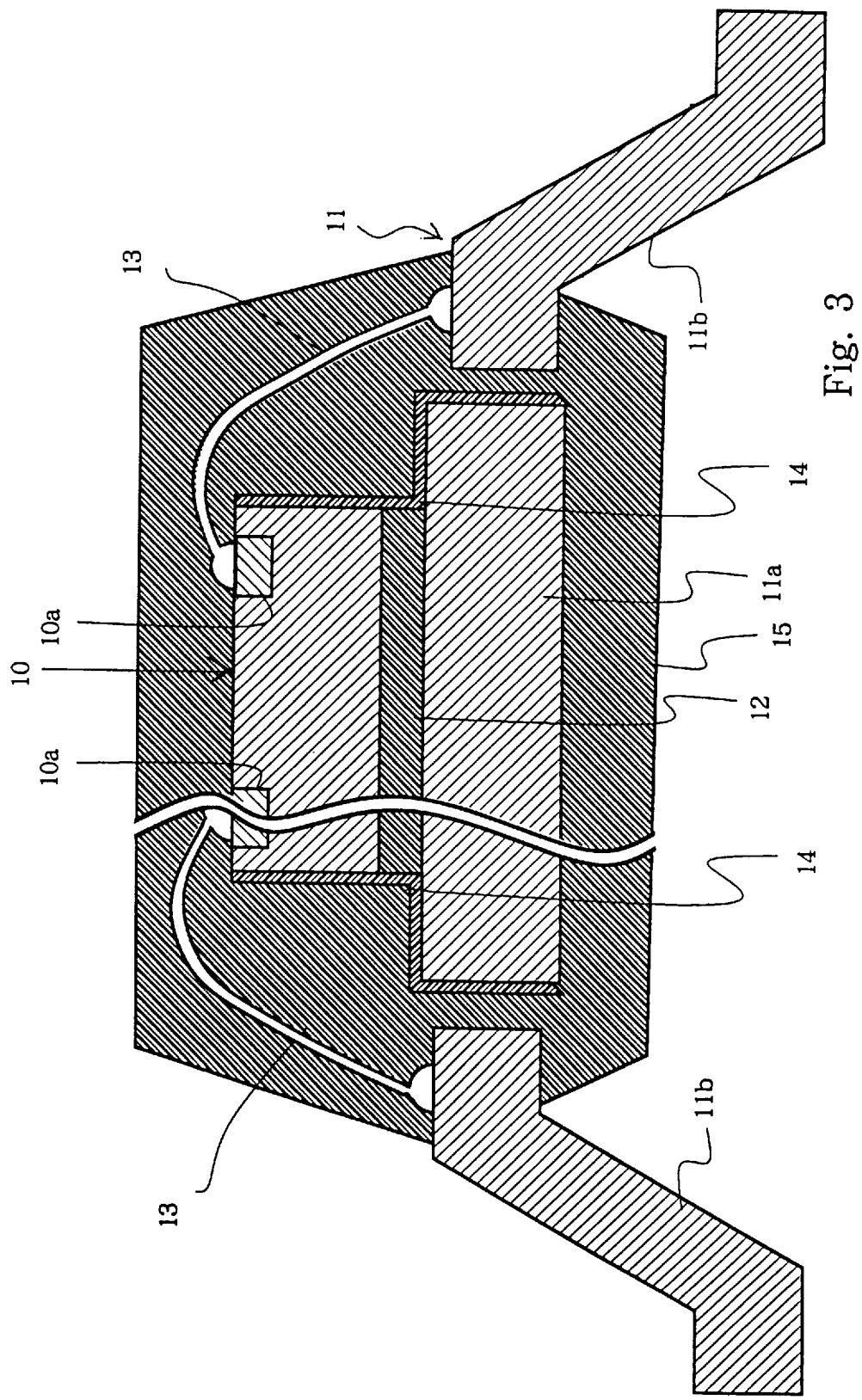
FIG. 3 is a cross sectional view showing the structure of a semiconductor device according to the present invention.

Referring to FIG. 3 of the drawings, a semiconductor device embodying the present invention largely comprises a semiconductor chip 10, a lead-frame 11, an adhesive compound layer 12, thin metallic wires 13, a stress relaxation layer 14 and a plastic package 15. The stress relaxation layer 14 is newly added to the semiconductor device, and the lead-frame serves as a conductive supporting structure.

Electric circuit components (not shown) are integrated on the semiconductor chip 10, and the integrated circuit is connected to bonding pads 10a. On the other hand, the lead-frame 11 has a die pad 11a and conductive leads 11b, and the conductive leads 11b are separated from the die pad 11a. An central area of the upper surface of the die pad 11a is coated with adhesive compound, and the adhesive compound layer 12 bonds the semiconductor chip 10 to the die pad 11a. The thin metallic wires 13 are connected at the inner ends to the bonding pads 10a and at the outer ends to the conductive leads 11b, and the integrated circuit communicates with other external components through the conductive leads 11b and the thin metallic wires 13. In this instance, the lead-frame 11 and the thin metallic wires 13 are formed of copper alloy and gold, respectively, and the silver paste forms the adhesive compound layer 12.

The semiconductor chip 10, the die pad 11a, the thin metallic wires 13 and the stress relaxation layer 14 are sealed in the plastic package 15, and the plastic package 15 is formed of synthetic resin containing moisture absorbent. Silica particle containing epoxy resin is available for the plastic package, and the elastic modulus thereof ranges from 1000 kg/mm$^2$ to 3000 kg/mm$^2$ much larger than that of the stress relaxation layer. The elastic modulus is varied with the amount of silica particle.

The stress relaxation layer 14 extends on the side surfaces of the semiconductor chip 11, the side surfaces of the adhesive compound layer 12, the peripheral area of the upper surface of the die pad 11a and the side surfaces of the die pad 11a. The stress relaxation layer 14 is formed of organic compound with a small elastic modulus, and is spread by using dispenser. The organic compound for the stress relaxation layer 14 is required to have an elastic modulus smaller than the elastic modulus of the synthetic resin for the plastic package. In this instance, the stress relaxation layer 14 is, by way of example, formed of epoxy resin. The elastic modulus of the epoxy resin is 350 kg/mm$^2$. Silicone resin and polyimide are available for the stress relaxation layer 14 in so far as the elastic modulus thereof is smaller than the synthetic resin for the plastic package 15.

The semiconductor device is fabricated as follows. When a semiconductor wafer is separated into the semiconductor chips, the lead-frame 11 is unwound from a reel (not shown), and the semiconductor chip 10 is bonded to the central area of the die pad 11a by means of the adhesive compound 12.

Subsequently, the stress relaxation layer 14 is spread by using the dispenser (not shown), and the side surface of the semiconductor chip 10, the peripheral area and the side surface of the die pad 11a are coated with the stress relaxation layer 14. The conductive leads 11b are connected to the bonding pads 10a through the thin metallic wires 13 by using a wire bonding technology.

The lead-frame 11 assembled with the semiconductor chip 10 is transferred to a transfer molding machine (not shown), and is placed in a molding die (not shown). The synthetic resin is injected into the molding die, and the semiconductor chip 10 and the die pad 11a are sealed in the plastic package 15.

Finally, the lead-frame 11 is separated from the reel, and the conductive leads 11b are bent as shown in FIG. 3.

Second Embodiment

Figure 4:
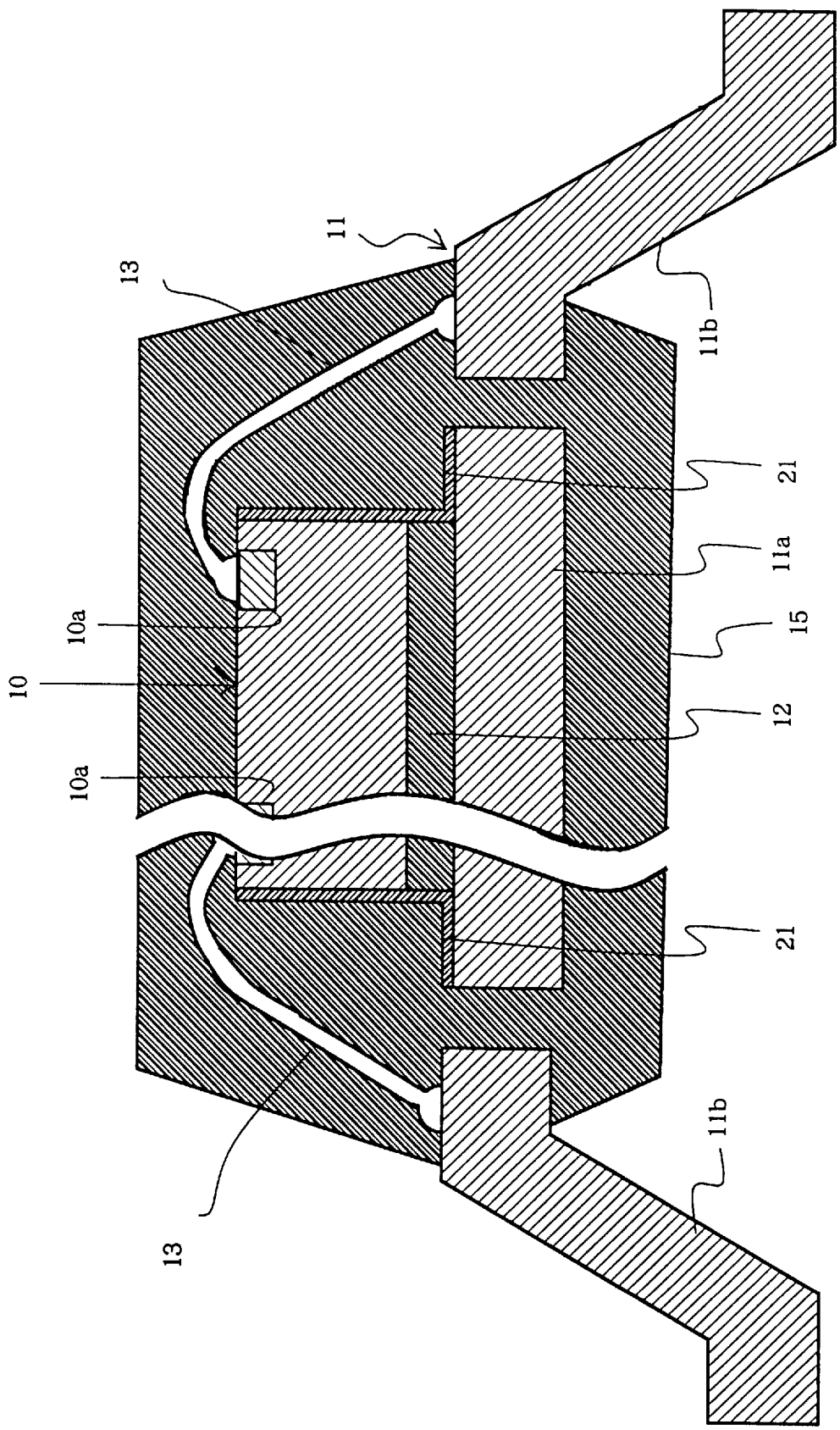
FIG. 4 is a cross sectional view showing the structure of another semiconductor device according to the present invention.

FIG. 4 illustrates another semiconductor device embodying the present invention. The semiconductor device implementing the second embodiment is similar to the first embodiment except for a stress relaxation layer 21. For this reason, the other components of the second embodiment are labeled with the references designating corresponding components of the first embodiment without detailed description.

The stress relaxation layer 21 covers the side surface of the semiconductor chip 10 and the peripheral area of the die pad 11a, and the stress relaxation layer 21 and the plastic package 15 are formed of the same materials as those of the first embodiment. The assembling process is analogous to that of the first embodiment.

Third Embodiment

Figure 5:
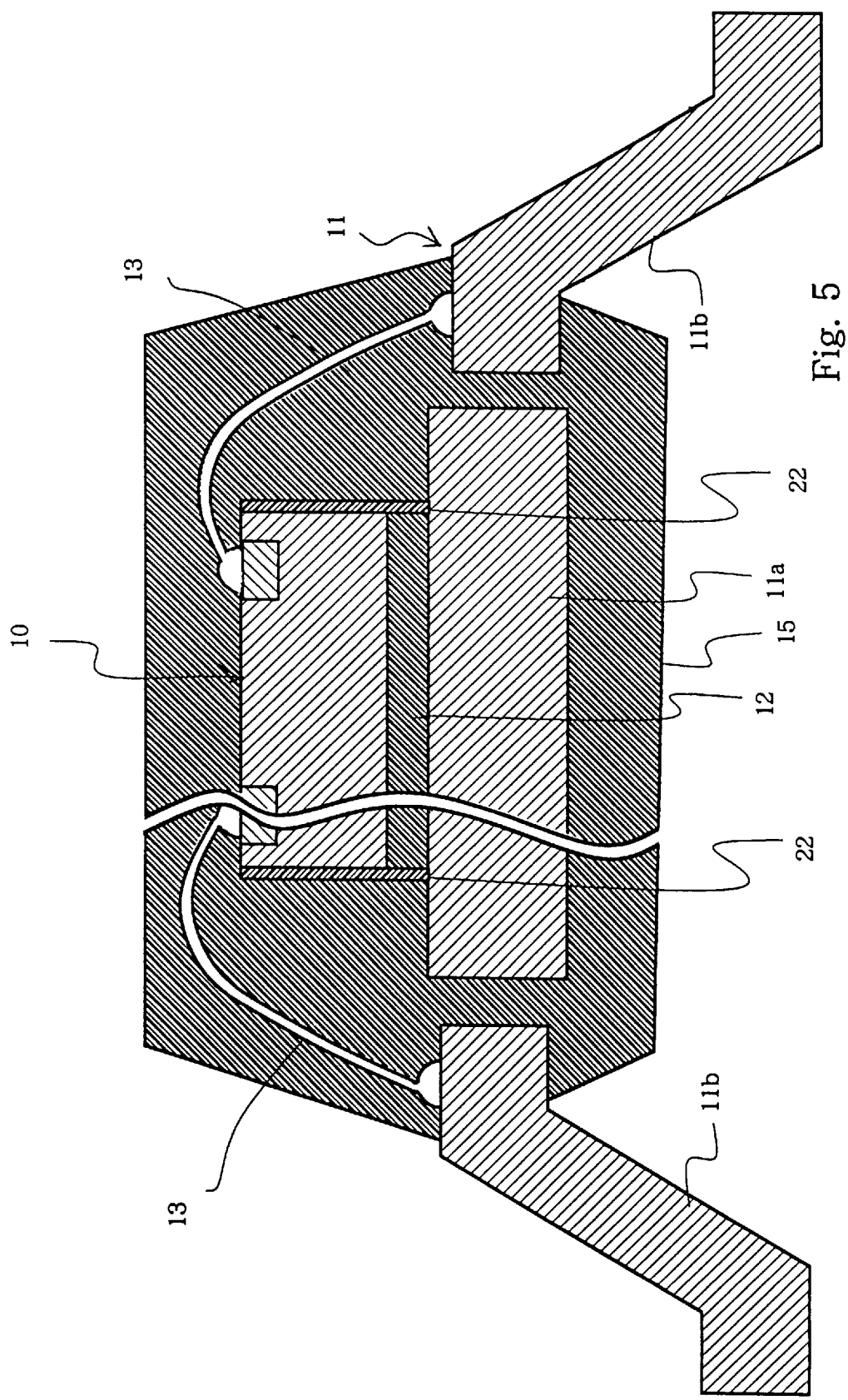
FIG. 5 is a cross sectional view showing the structure of yet another semiconductor device according to the present invention.

FIG. 5 illustrates yet another semiconductor device embodying the present invention. The semiconductor device implementing the third embodiment is similar to the first embodiment except for a stress relaxation layer 22. For this reason, the other components of the second embodiment are labeled with the references designating corresponding components of the first embodiment without detailed description.

The stress relaxation layer 22 covers the side surface of the semiconductor chip 10 only, and the stress relaxation layer 22 and the plastic package 15 are formed of the same material as those of the first embodiment. The assembling process is analogous to that of the first embodiment.

Evaluation

The present inventor evaluated the semiconductor devices implementing the first to third embodiments as follows.

Figure 1:
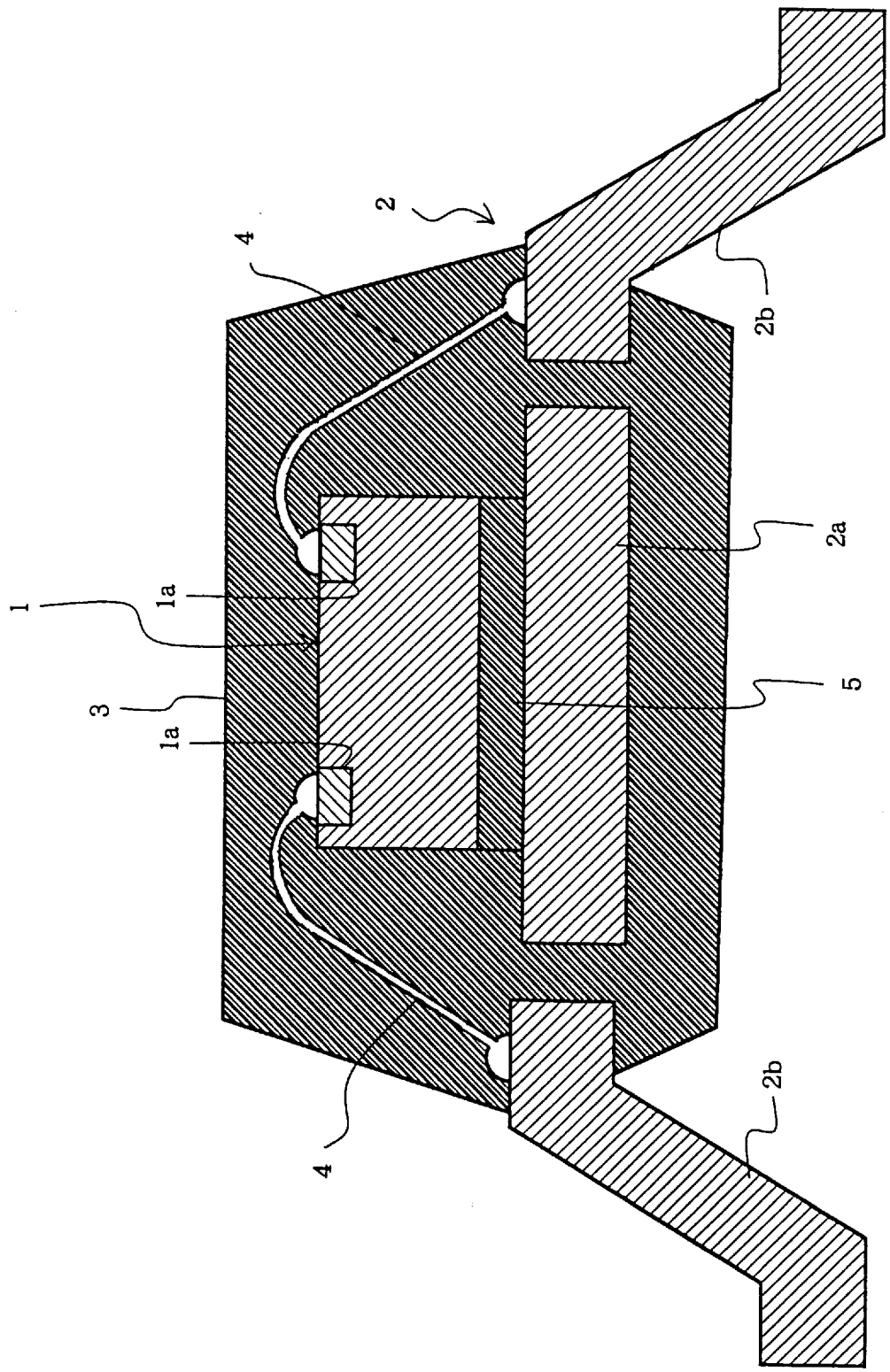
FIG. 1 is a cross sectional view showing the structure of the prior art semiconductor device.
Figure 2A:
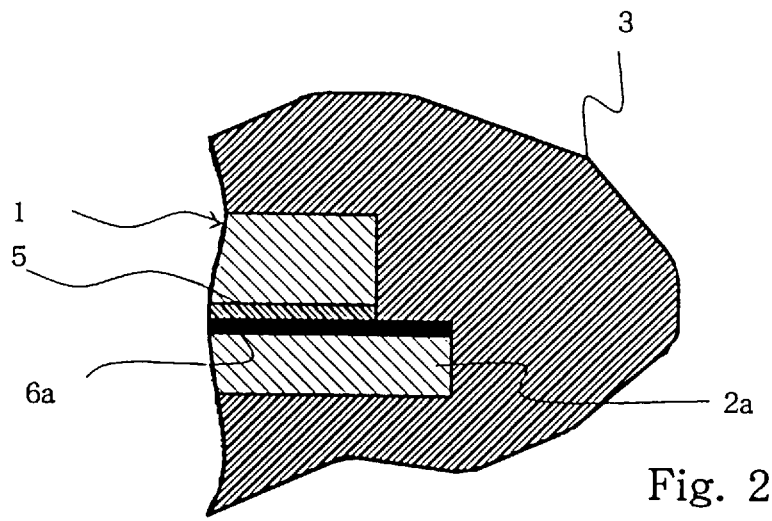
FIGS. 2A to 2C are cross sectional views showing the separation and the crack due to the thermal stress.
Figure 2B:
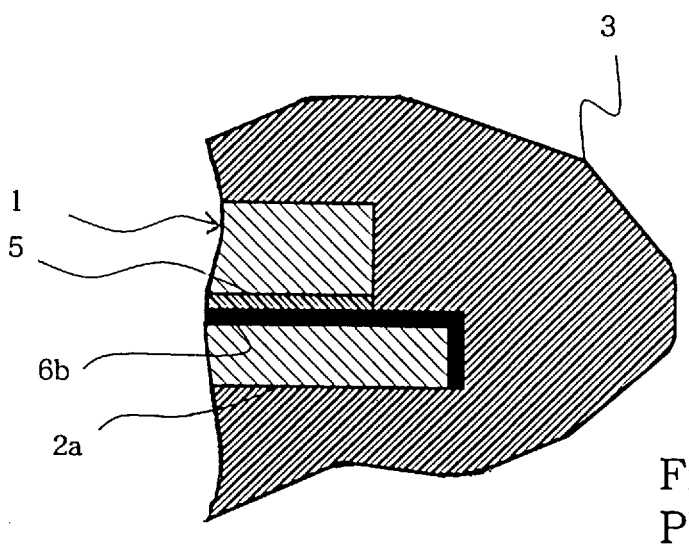
Figure 2C:
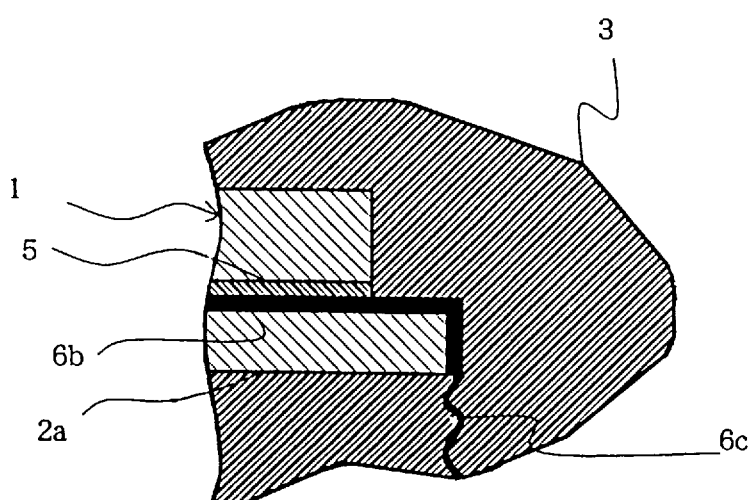

The present inventor firstly fabricated the semiconductor device implementing the first embodiment, the semiconductor device implementing the second embodiment, the semiconductor device implementing the third embodiment and the prior art semiconductor device shown in FIG. 1. The semiconductor devices were a 26-pin plastic molded type having small outline J-leads arranged at 350 mil, and the semiconductor chips were 15.2 millimeters in width and 5.94 millimeters in length. Three samples were prepared for each of the semiconductor devices.

The twelve samples, i.e., three samples of the first embodiment, three samples of the second embodiment, three samples of the third embodiment and three samples of the prior art were subjected to a heat cycle a thousand times. The twelve samples were heated to 150 degrees in centigrade, and were maintained in the high temperature ambience for 30 minutes. Then, the twelve samples were cooled down to −65 degrees in centigrade, and were maintained in the low temperature ambience for 30 minutes. Thus, the heat cycle was repeated between +150 degrees in centigrade and −65 degrees in centigrade.

Figure 6:
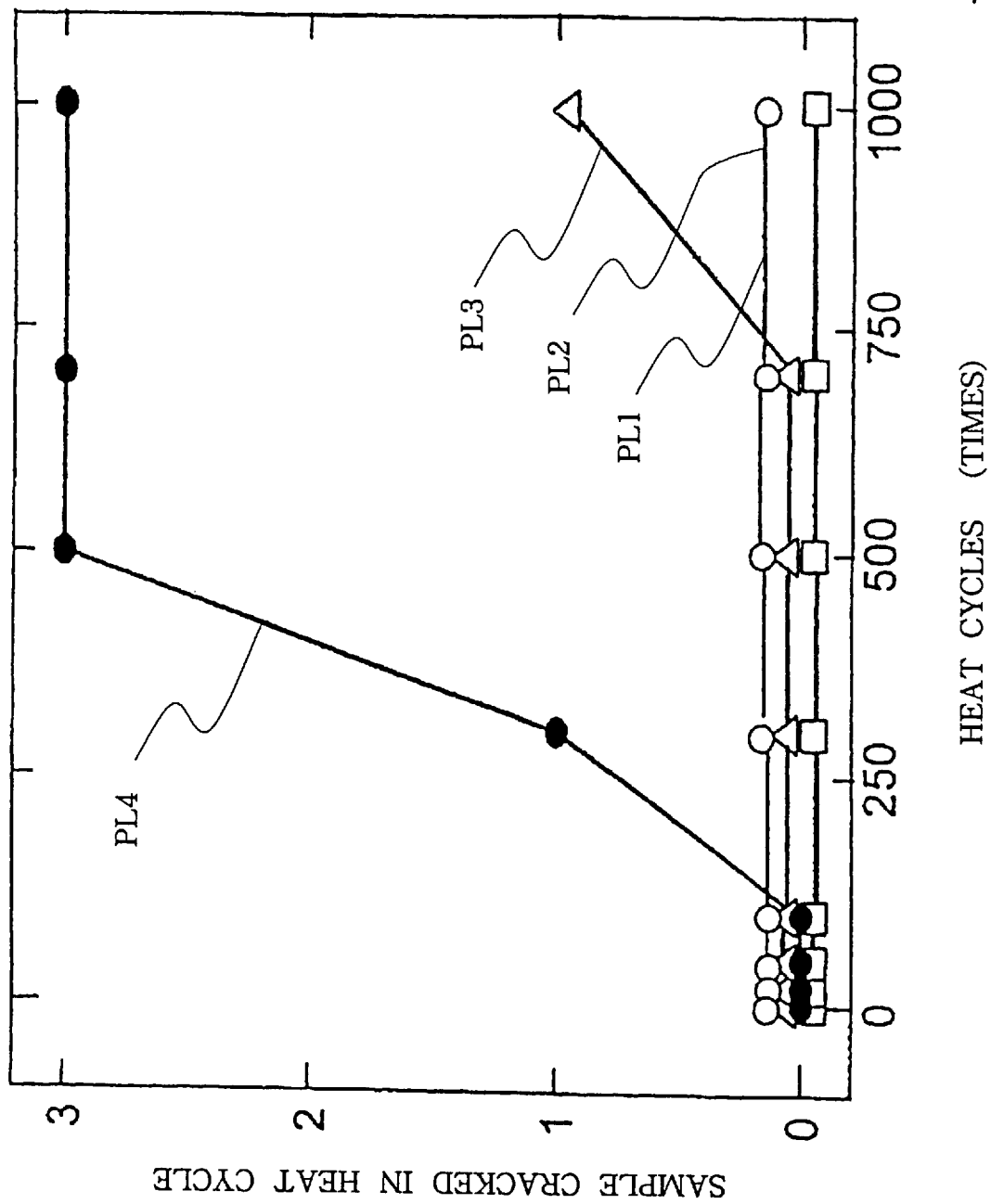
FIG. 6 is a graph showing the number of samples with cracks in terms of a heat cycle.

The present inventor periodically observed the samples to see whether or not the samples were cracked, and plotted the number of samples cracked in the heat cycles as shown in FIG. 6. Plots PL1, PL2, PL3 and PL4 stood for the first embodiment, the second embodiment, the third embodiment and the prior art, respectively. Any crack was observed in the samples of the first and second embodiments after the thousand heat cycles, and any sample of the third embodiment was never cracked until seven hundred and fifty heat cycles. However, one sample of the prior art was cracked at three hundred heat cycles, and the cracks were observed in all the samples of the prior art at five hundred heat cycles. Thus, the present inventor confirmed that the stress relaxation layers 14, 21 and 22 were effective against the crack.

Figure 7A:
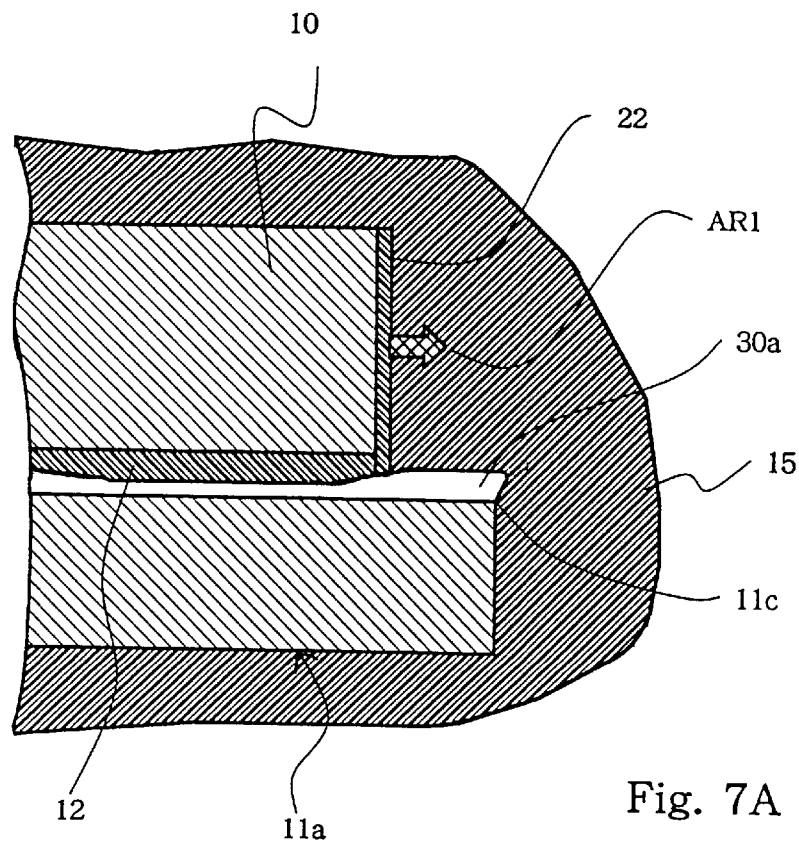
FIGS. 7A and 7B are cross sectional views showing boundary separations observed in the samples.
Figure 7B:
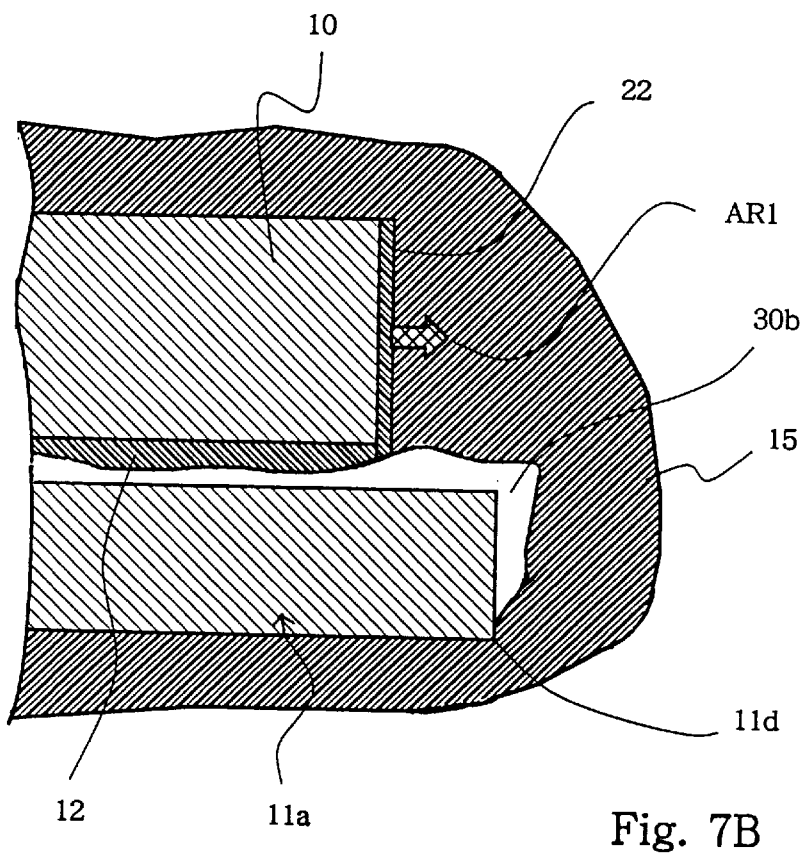

Subsequently, the present inventor cut the samples, and observed how a separation took place between the die pads 11a and the semiconductor chip 10. The adhesion compound layers 12 were peeled from the die pads 11a in the low temperature ambience due to the difference in thermal expansion coefficient between the semiconductor chip 10 and the lead-frame 11 during the heat cycles. The semiconductor chip 10 exerted a force AR1 (see FIGS. 7A and 7B) on the plastic package 15. A separation 30a took place at the upper edge 11c of the die pad 11a, and the separation 30a proceeded from the upper edge 11c along the boundary between the plastic package 15 and the die pad 11a and the boundary between the adhesive compound layer 12 and the die pad 11a (see FIG. 7A). However, no crack was observed in the plastic package 15.

In another sample, the plastic package 15 was further separated along the side surface of the die pad (see FIG. 7B), and the separation concentrated the stress at the lower edge 11d of the die pad 11a. However, no crack was observed in the plastic package 15.

The separation 30b was observed in the sample of the prior art, and the plastic package 3 was cracked. The reason why the separations 30a and 30b did not result in the crack in the plastic packages 15 was that the stress relaxation layers 22 reduced the force AR1 through a deformation thereof.

As will be appreciated from the foregoing description, the stress relaxation layers 14, 21 and 22 reduce the force exerted on the plastic packages 15, and improve the reliability of the semiconductor devices. The organic stress relaxation layers are spread by using the dispenser, and the expensive deposition systems are not necessary. For this reason, the stress relaxation layers do not increase the production cost of the semiconductor device.

Although particular embodiments of the present invention have been shown and described, it will be obvious to those skilled in the art that various changes and modifications may be made without departing from the spirit and scope of the present invention.

The present invention may be applied to a discrete semiconductor device. The semiconductor chip may be soldered to the die pad.

The lead-frame is not restricted to the copper alloy. The stress relaxation layer is effective against cracks in so far as the semiconductor chip and the die pad are different in thermal expansion coefficient.

The side surface of the semiconductor chip and the peripheral area and the side surface of the die pad may be coated with the stress relaxation layers before the adhesion between the semiconductor chip and the die pad.

What is claimed is:

1. A semiconductor device comprising:

a semiconductor chip having at least one electric element;

a conductive supporting structure including at least a die pad having a central area assigned to said semiconductor chip for mounting and a peripheral area around said central area;

a package formed of a synthetic resin for sealing said semiconductor chip mounted on said die pad therein; and a stress relaxation layer formed of an organic compound smaller in elastic modulus than said synthetic resin, and covering a side surface of said semiconductor chip.

2. The semiconductor device as set forth in claim 1, in which said stress relaxation layer further covers said peripheral area of said die pad.

3. The semiconductor device as set forth in claim 2, in which said stress relaxation layer further covers a side surface of said die pad.

4. The semiconductor device as set forth in claim 1, in which said organic compound is selected from the group consisting of silicone resin, epoxy resin and polyimide.

5. The semiconductor device as set forth in claim 1, in which said lead-frame further includes conductive leads separated from said die pad and projecting from said package, and said conductive leads and electrodes of said semiconductor chip are electrically connected by means of thin conductive wires.

* * * * *